United States Patent
Chuang et al.

(10) Patent No.: US 6,441,766 B1
(45) Date of Patent: Aug. 27, 2002

(54) CHARGE INTEGRATION ALGORITHMIC ANALOG-TO-DIGITAL CONVERTER AND ITS CONVERTING METHOD

(75) Inventors: Chao-Kuei Chuang, Hsinchu; Jung Che Chang, Tainan, both of (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 0 days.

(21) Appl. No.: 09/717,014

(22) Filed: Nov. 22, 2000

(51) Int. Cl.[7] ............................................... H03M 1/12
(52) U.S. Cl. ...................................... 341/155; 341/159
(58) Field of Search ................................. 341/155, 159, 341/161; 327/104; 250/208.1; 348/250

(56) References Cited

U.S. PATENT DOCUMENTS

| | | | | |
|---|---|---|---|---|
| 5,789,736 A | * | 8/1998 | Kawahara | ................ 250/208.1 |
| 5,801,657 A | * | 9/1998 | Fowler et al. | ............... 341/155 |
| 6,124,819 A | * | 10/2000 | Zhou et al. | ................. 341/155 |
| 6,166,367 A | * | 12/2000 | Cho | ........................ 250/208.1 |

* cited by examiner

*Primary Examiner*—Peguy JeanPierre
*Assistant Examiner*—Joseph Lauture
(74) *Attorney, Agent, or Firm*—Bacon & Thomas

(57) ABSTRACT

A charge integration algorithmic analog-to-digital converter utilizes one operational amplifier to perform an algorithm analog-to-digital conversation. In a first operating cycle, the ratio of a third capacitor to a fourth capacitor is used as a gain to determine an output voltage and an output bit. The output voltage is held in a first and second capacitors. In the second operating cycle, the ratio of the first capacitor to the second capacitor is used to determine an output voltage and an output bit. The output voltage is held in the third and fourth capacitors. The first and second operating cycles are repeated for generating converted digital data.

10 Claims, 3 Drawing Sheets

CHARGE INTEGRATION ALGORITHMIC ANALOG-TO-DIGITAL CONVERTER AND ITS CONVERTING METHOD

BACKGROUND OF THE INVENTION

1. Field of the Invention

The present invention relates to the field of analog-to-digital converters and, more particularly, to a charge integration algorithmic analog-to-digital converter and its converting method.

2. Description of Related Art

Currently, the analog-to-digital converter (A/D converter) is in widely spread use. One of the applications is for converting the analog image signal, captured by an image sensor, into digital data for being processed by a digital signal processor. In general, such an A/D converter determines the digital value from an analog signal via a cyclic operation. Therefore, it is necessary to have an operational amplifier to sample and hold the input signal, and another operational amplifier to perform the cyclic operation. As a result, there are two operational amplifiers required. Therefore, the integrated circuit layout area is large and the miniaturization of the A/D converter is difficult.

In the known patents, U.S. Pat. No. 5,929,800, entitled "Charge integration successive approximation analog-to-digital converter for focal plane applications using a single amplifier", employs a single (or double) charge integrating amplifier in a charge balancing architecture to implement successive approximation analog-to-digital conversion. Such an A/D converter is provided with a correlated double sampling (CDS) function, but no programmable gain amplifier (PGA) function available.

U.S. Pat. No. 5,880,691, entitled "Capacitively coupled successive approximation ultra low power analog-to-digital converter", uses a capacitively coupled multiplying digital-to-analog converter (CCMDAC) to generate a succession of voltages which are compared to the input voltage to be digitized. Similar to the aforementioned patent, this A/D converter is provided with a CDS function, but no PGA function available.

U.S. Pat. No. 5,920,274, entitled "Image sensor employing non-uniform A/D conversion", has A/D converters coupled to column bit lines of a sensor array. It's A/D converting circuit is implemented by a single slope A/D converter or a non-linear successive approximation A/D converter, so as to provide a higher resolution for darker light levels while having a slower converting speed. In addition, its A/D converter is provided with a CDS function, but no PGA function available.

U.S. Pat. No. 5,886,659, entitled "On-focal-plane analog-to-digital conversion for current-mode imaging devices", discloses a current-mode A/D converter that includes one first-order sigma-delta modulator based on a current copier cell with a constant bias that is independent of the input signals. Two or more of the first-order sigma-delta modulators may be cascaded to form a second-order or multiple-order incremental sigma-delta A/D converter to achieve high precision and high resolution analog-to-digital conversion. Such an A/D converter is provided with a CDS function, but no PGA function available.

U.S. Pat. No. 5,801,657, entitled "Controller to maintain a certain set of environmental parameters in an environment", describes a method for simultaneously performing bit serial analog-to-digital conversion for image sensor, which employs a one-bit comparator per channel (or set of multiplexed channels) and an N-bit digital-to-analog converter to achieve N-bit precision. Furthermore, a non-uniform quantization where the subintervals have different lengths is used to perform gamma correction or compression. The present analog-to-digital conversion is not provided with the CDS and PGA functions.

Therefore, it is known that most of the conventional A/D converters do not have both PGA and CDS functions, and moreover, the circuit layout area is large. Accordingly, there is need for the above analog-to-digital converters to be improved.

SUMMARY OF THE INVENTION

The object of the present invention is to provide a charge integration algorithmic analog-to-digital converter and its converting method for effectively reducing the circuit layout area, providing satisfactory operating speed and low power consumption, and supporting PGA, CDS and gamma correction functions.

According to one aspect, the present invention which achieves the object relates to a charge integration algorithmic analog-to-digital converter for performing an analog to digital conversion to a signal voltage and a reset voltage by referencing a top reference, a bottom reference and a middle reference. The converter comprises an operational amplifier, a first capacitor, a second capacitor, a third capacitor, and a fourth capacitor. In a correlated double sampling phase, the signal voltage is sampled and charged to the first capacitor, and then the reset voltage is sampled and the charge of the first capacitor is transferred to the second capacitor, so as to determine an output voltage and an output bit, based on the reset voltage, the signal voltage, and the top reference, by the operational amplifier using a ratio of the first capacitor to the second capacitor as a gain. The output voltage is held in the third and fourth capacitors. In a first operating cycle, the third capacitor is charged to the fourth capacitor whose charge is further transferred to the output voltage, so as to determine an output voltage and an output bit, based on the previous output voltage, middle reference, top reference and bottom reference, by the operational amplifier using a ratio of the third capacitor to the fourth capacitor as a gain. The output voltage is held in the first and second capacitors. In a second operating cycle, the first capacitor is charged to the second capacitor whose charge is further transferred to the output voltage, so as to determine an output voltage and an output bit, based on the previous output voltage, middle reference, top reference and bottom reference, by the operational amplifier using a ratio of the first capacitor to the second capacitor as a gain. The output voltage is held in the third and fourth capacitors. The first and second operating cycles are alternately and cyclically executed.

According to one aspect, the present invention which achieves the object relates to a charge integration algorithmic analog-to-digital converting method for converting input voltage into digital data. The method comprises the steps of: (A) comparing the input voltage VX with a middle reference VCMB, so as to execute step (B) when VX>VCMB, or execute step (C) when VX<VCMB; (B) determining VX=2*VX−VRT and producing an output bit of 1, and then executing step (A) again, where VRT is a top reference; and (C) determining VX=2*VX−VRB and producing an output bit of 0, and then executing step (A) again, where VRB is a bottom reference.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
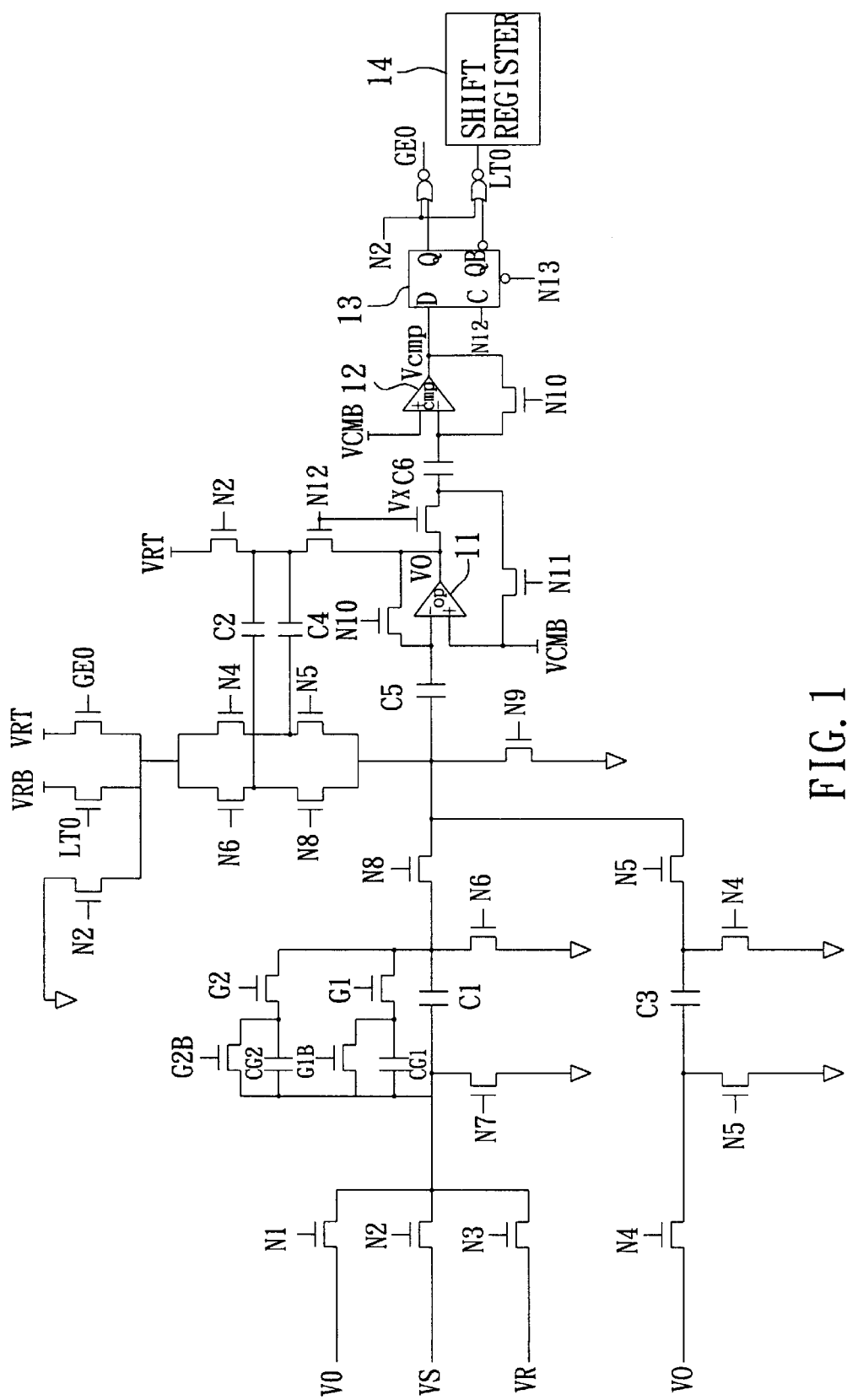
FIG. 1 is a circuit diagram of the charge integration algorithmic analog-to-digital converter in accordance with the present invention.

With reference to FIG. 1, there is shown a preferred embodiment of the charge integration algorithmic analog-to-digital converter in accordance with the present invention. The converter includes an operational amplifier 11, an one-bit comparator 12, a latch 13, a shift register 14, and a plurality of capacitors and switch transistors for converting an input voltage into digital data for being output through the shift register 14. The range of voltage that can be converted is defined by the constant voltage references VRT and VRB, where VRT is the top reference and VRB is the bottom reference, and a middle reference VCMB is defined to be the average value of the VRT and VRB.

Figure 2:
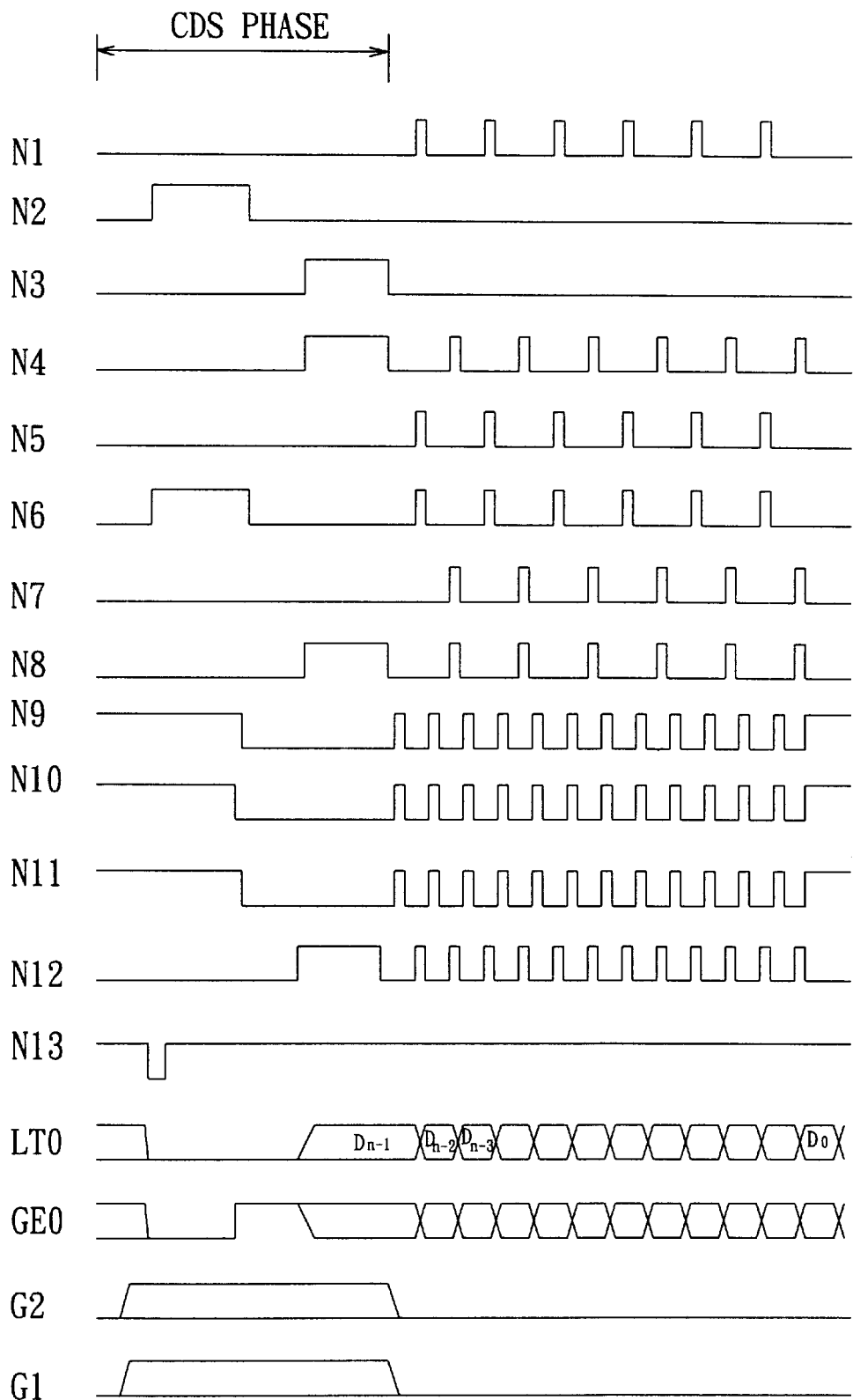
FIG. 2 is a timing diagram of the charge integration algorithmic analog-to-digital converter in accordance with the present invention.

FIG. 2 is a timing diagram for the converter circuit described hereinbefore. As shown, the circuit is first operated in a CDS phase, in which node N2 is raised high so that the N2-controlled switch transistor is on. Therefore, the signal voltage VS representing signals sensed by an image sensor can be input into the circuit, so as to charge a capacitor C1 to a voltage of VS. In the same time, the nodes N6, N9, N10, and N11 are raised high so that the controlled switch transistors are turned on for being grounded, thereby initializing the operational amplifier 11 and the comparator 12. Furthermore, The capacitor C5 is charged to have the offset voltage Vos1 of the operational amplifier 11, and the capacitor C6 is charged to have the offset voltage Vos2 of the comparator 12, so as to compensate these offset voltages in the subsequent operations.

If the signal voltage VS has to be amplified, node G1 is raised high to turn on the G1-controlled transistor, such that the capacitor C1 and capacitor CG1 are connected in parallel, thereby increasing the capacitance charged by the voltage VS and achieving the object of amplifying the signal voltage VS. In addition, the capacitor C1 may be connected to other capacitors CG2, CG3, . . . in parallel, as desired, for further amplifying the signal voltage VS. Therefore, the PGA function can be achieved.

After the voltage VS is sampled, nodes N3 and N8 are raised high and node N6 goes low, so as to turn on the N3- and N8-controlled transistors and turn off the N6-controlled transistor, respectively, for reading the voltage VR representing a reset signal. Furthermore, the charge of the capacitor C1 (and the capacitors CG1, CG2, . . . , which are possibly connected thereto in parallel) is transferred to the capacitor C2 for determining the difference of image signals. If the capacitor C1 is connected in parallel with the capacitors CG1 and CG2, there is an amplification gain existed in the charge transfer. The gain is equal to the ratio of capacitors, $(C1+CG1*G1+CG2*G2)/C2$. Therefore, the operational amplifier 11 performs an operation of $((C1+CG1*G1+CG2*G2)/C2)*(VR-VS)$. Furthermore, node N12 is raised high and the controlled transistor is on, so that voltage VRT is applied to the operational amplifier 11, thereby determining the output voltage $VO=VX=-((C1+CG1*G1+CG2*G2)/C2)*(VR-VS)+VRT$. Moreover, because node N4 is raised high and the controlled transistor is on, the output voltage VO is sampled and held in the capacitors C3 and C4.

If the determined voltage VX is larger than the VCMB, the output of the comparator 12 is low. The pin Q of the latch 13 is low, and the pin QB thereof is high, so that the NOR gate outputs GE0 and LT0 are high and low, respectively. The output LT0 is applied to the shift register 14 for being provided as the most significant bit (MSB) of the converted digital data, i.e., the $D_{N-1}$ bit shown in the figure. The output GE0 is provided to turn on GE0-controlled transistor, so as to apply voltage VRT to the circuit for performing subsequent operations.

If the determined voltage VX is smaller than the VCMB, the output of the comparator 12 is high. The pin Q of the latch 13 is high, and the pin QB thereof is low, so that the NOR gate outputs GE0 and LT0 are low and high, respectively. Similarly, the output LT0 is applied to the shift register 14 for being provided as the most significant bit (MSB) of the converted digital data. The output LT0 is also provided to turn on LT0-controlled transistor, so as to apply voltage VRB to the circuit for performing subsequent operations.

Since the circuit utilizes both of the signal voltage VS and the reset voltage VR for performing analog-to-digital conversion, the CDS function can be achieved.

After the CDS phase is completed, the circuit enters a first operating cycle, in which nodes N9, N10 and N11 are raised high for turning on the controlled transistors, so as to reset the operational amplifier 11, and comparator 12. Then, nodes N1, N5 and N6 are raised high for turning on the controlled transistors, such that the capacitor C4 is charged by the capacitor C3 and the charge is transferred to the output voltage VO. Moreover, node N12 is also raised high to turn on the controlled transistor, thereby determining voltage $VX=(C3/C4)*VO+VO-VRT$ (if VX>VCMB) or voltage $VX=(C3/C4)*VO+VO-VRB$ (if VX>VCMB). In this preferred embodiment, we have $C1/C2=C3/C4$ and $C1=C2=C3=C4$. Therefore, we have voltage $VX=2VO-VRT$ (if VX>VCMB) or voltage $VX=2VO-VRB$ (if VX>VCMB). Moreover, since node N1 is raised high, the output voltage VO is sampled and held in the capacitors C1 and C2. Similar to the generation of the $D_{N-1}$-th bit, after the voltage VX is processed by the comparator 12 and latch 13, a $D_{N-2}$-th bit can be generated and stored in the shift register 14.

After completing the first operating cycle, the circuit enters a second operating cycle, in which nodes N9, N10, and N11 are raised high for turning on the controlled transistors, so as to reset the operational amplifier 11 and comparator 12. Then, nodes N4, N7 and N8 are raised high for turning on the controlled transistors, such that the capacitor C2 is charged by the capacitor C1 and the charge is transferred to the output voltage VO. Moreover, node N12 is also raised high to turn on the controlled transistor, thereby determining voltage $VX=(C1/C2)*VO+VO-VRT=2VO-VRT$ (if VX>VCMB)or voltage $VX=(C1/C2)*VO+VO-VRB=2VO-VRB$ (if VX>VCMB). Moreover, since node N4 is raised high, the output voltage VO is sampled and held in the capacitors C3 and C4. Similar to the generation of the $D_{N-1}$-th bit, after the voltage VX is processed by the comparator 12 and latch 13, a $D_{N-3}$-th bit can be generated and stored in the shift register 14.

After alternately repeating the first and second cycles, the bits of the converted data are continuously input into the shift register 14 until the least significant bit (LSB) is generated. As such, digital data representing the input analog image signal can be obtained in the shift register 14. Moreover, it is applicable to append an encoding converter to the output of the shift register 14 for performing a gamma correction process by table lookup.

Figure 3:
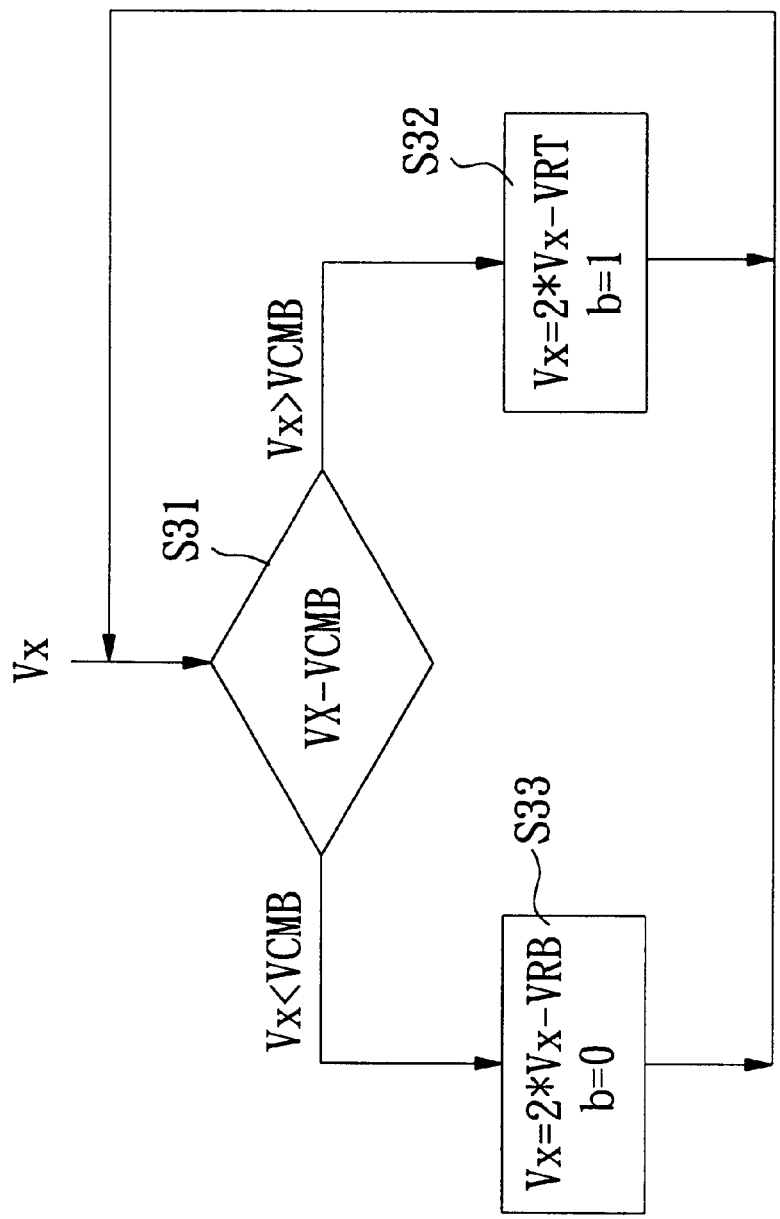
FIG. 3 is the algorithmic flowchart of the charge integration algorithmic analog-to-digital converter in accordance with the present invention.

FIG. 3 shows the flowchart of the circuit to perform an analog-to-digital conversion. At first, the input voltage VX is compared with the middle reference VCMB (step S31). If VX>VCMB, VX is determined by VX=2*VX−VRT and an output bit (b) of 1 is produced (step S32). Then, step S31 is executed again. If step S31 determines that VX<VCMB, VX is determined by VX=2*VX−VRB and an output bit (b) of 0 is produced (step S33). Then, step S31 is executed again. Analogous to the operating cycles of the circuit, these processing steps are executed repeatedly until an LSB is generated, so as to generate all the bits of the converted digital data.

Moreover, in the CDS phase, the reset voltage VR is always larger than the signal voltage VS. This will result in that the converted output is inversely proportional to the light intensity of the input image signal. Therefore, the output digital data needs to be reversed by 1's complement in order to obtain the normal polarity code representation. That is, the whiter pixel has a larger binary data code and the darker pixel has a smaller binary data code. Thus, the LT0 output is sent to the shift register 14 for being provided as the converted digital data. On the contrary, if the complement of the data is desired, the GEO output is sent to the shift register 14.

In view of the foregoing, it is known that the operation of the charge integration algorithmic analog-to-digital converter in accordance with the present invention is accomplished with a charge integration operational amplifier 11 and two sets of capacitors C1 and C2, and C3 and C4, whose functions are alternate. That is, in the first operating cycle, the capacitors C3 and C4 are used to generate a gain for operation, and the capacitors C1 and C2 are used to hold the sampled output voltage VO for the next operating cycle, and in the second operating cycle, the capacitors C1 and C2 are used to generate a gain for operation, and the capacitors C3 and C4 are used to hold the sampled output voltage VO for the next operating cycle. Consequently, there is no sample-and-hold amplifier required, and thus only one operational amplifier is required to implement the analog-to-digital converter, thereby effectively reducing the area for circuit layout, and providing satisfactory operating speed and low power consumption. Moreover, the PGA and CDS functions are also available. It is also applicable to easily append a converter for providing the gamma correction function.

Although the present invention has been explained in relation to its preferred embodiment, it is to be understood that many other possible modifications and variations can be made without departing from the spirit and scope of the invention as hereinafter claimed.

What is claimed is:

1. A charge integration algorithmic analog-to-digital converter for performing an analog to digital conversion to a signal voltage and a reset voltage by referencing a top reference, a bottom reference and a middle reference, the converter comprising an operational amplifier, a first capacitor, a second capacitor, a third capacitor, and a fourth capacitor, wherein:

in a correlated double sampling phase, the signal voltage is sampled and charged to the first capacitor, and then the reset voltage is sampled and the charge of the first capacitor is transferred to the second capacitor, so as to determine an output voltage and an output bit, based on the reset voltage, the signal voltage, and the top reference, by the operational amplifier using a ratio of the first capacitor to the second capacitor as a gain, the output voltage being held in the third and fourth capacitors;

in a first operating cycle, the third capacitor charges the fourth capacitor whose charge is further transferred to the output voltage, so as to determine an output voltage and an output bit, based on the previous output voltage, middle reference, top reference and bottom reference, by the operational amplifier using a ratio of the third capacitor to the fourth capacitor as a gain, the output voltage being held in the first and second capacitors; and in a second operating cycle, the first capacitor charges the second capacitor whose charge is further transferred to the output voltage, so as to determine an output voltage and an output bit, based on the previous output voltage, middle reference, top reference and bottom reference, by the operational amplifier using a ratio of the first capacitor to the second capacitor as a gain, the output voltage being held in the third and fourth capacitors, the first and second operating cycles being alternately and cyclically executed, wherein, in the correlated double sampling phase, the output voltage is determined by VO=VX=−(C1/C2)*(VR−VS)+VRT, where C1 is the capacitance of the first capacitor, C2 is the capacitance of the second capacitor, VR is the reset voltage, VS is the signal voltage, and VRT is the top reference.

2. The charge integration algorithmic analog-to-digital converter as claimed in claim 1, wherein said first capacitor is further connected to at least one capacitor in parallel.

3. The charge integration algorithmic analog-to-digital converter as claimed in claim 2, wherein, in the first operating cycle, the output voltage is determined by VO=VX=(C3/C4)*VO+VO−VRT if VX>VCMB, or VO=VX=(C3/C4)*VO+VO−VRB if VX>VCMB, where C3 is the capacitance of the third capacitor, C4 is the capacitance of the fourth capacitor, VRB is the bottom reference, and VCMB is the middle reference.

4. The charge integration algorithmic analog-to-digital converter as claimed in claim 3, wherein, in the second operating cycle, the output voltage is determined by VO=VX=(C1/C2)*VO+VO−VRT if VX>VCMB, or VO=VX=(C1/C2)*VO+VO−VRB if VX>VCMB.

5. The charge integration algorithmic analog-to-digital converter as claimed in claim 1, wherein the first, second, third and fourth capacitors have the same capacitance.

6. The charge integration algorithmic analog-to-digital converter as claimed in claim 1, wherein, by repeating the first and second operating cycles, a plurality of bits that form a converted digital data are continuously input to a shift register until a least significant bit is generated.

7. A charge integration algorithmic analog-to-digital converter for performing an analog to digital conversion to a signal voltage and a reset voltage by referencing a top reference, a bottom reference and a middle reference, the converter comprising an operational amplifier, a first capacitor, a second capacitor, a third capacitor, and a fourth capacitor, wherein:

in a correlated double sampling phase, the signal voltage is sampled and charged to the first capacitor, and then the reset voltage is sampled and the charge of the first capacitor is transferred to the second capacitor, so as to determine an output voltage and an output bit, based on the reset voltage, the signal voltage, and the top reference, by the operational amplifier using a ratio of the first capacitor to the second capacitor as a gain, the output voltage being held in the third and fourth capacitors;

in a first operating cycle, the third capacitor charges the fourth capacitor whose charge is further transferred to the output voltage, so as to determine an output voltage and an output bit, based on the previous output voltage, middle reference, top reference and bottom reference, by the operational amplifier using a ratio of the third capacitor to the fourth capacitor as a gain, the output voltage being held in the first and second capacitors; and in a second operating cycle, the first capacitor charges the second capacitor whose charge is further transferred to the output voltage, so as to determine an output voltage and an output bit, based on the previous output voltage, middle reference, top reference and bottom reference, by the operational amplifier using a ratio of the first capacitor to the second capacitor as a gain, the output voltage being held in the third and fourth capacitors, the first and second operating cycles being alternately and cyclically executed, wherein the middle reference is an average of the top reference and bottom reference.

8. The charge integration algorithmic analog-to-digital converter as claimed in claim 7, wherein said first capacitor is further connected to at least one capacitor in parallel.

9. The charge integration algorithmic analog-to-digital converter as claimed in claim 7, wherein the first, second, third and fourth capacitors have the same capacitance.

10. The charge integration algorithmic analog-to-digital converter as claimed in claim 7, wherein, by repeating the first and second operating cycles, a plurality of bits that form a converted digital data are continuously input to a shift register until a least significant bit is generated.

* * * * *